US008791694B2

(12) United States Patent
Storkey et al.

(10) Patent No.: US 8,791,694 B2
(45) Date of Patent: Jul. 29, 2014

(54) CURRENT SENSOR ARRANGEMENT (75) Inventors: Matthew Storkey, Cambridge (GB); Andrew Dames, Cambridge (GB)

(73) Assignee: Sentec Ltd., Cambridge (GB)

( * ) Notice: Subject to any disclaimer, the term of this patent is extended or adjusted under 35 U.S.C. 154(b) by 265 days.

(21) Appl. No.: 13/390,294

(22) PCT Filed: Aug. 16, 2010

(86) PCT No.: PCT/EP2010/061917
§ 371 (c)(1),
(2), (4) Date: Feb. 13, 2012

(87) PCT Pub. No.: WO2011/018533
PCT Pub. Date: Feb. 17, 2011

(65) Prior Publication Data
US 2012/0139534 A1 Jun. 7, 2012

(30) Foreign Application Priority Data
Aug. 14, 2009 (GB) .................................. 0914259.7

(51) Int. Cl.
*G01R 33/02* (2006.01)
*G01N 27/82* (2006.01)
(52) U.S. Cl.
USPC ............................ 324/247; 324/246; 324/242
(58) Field of Classification Search
CPC ..... G01R 15/181; G01R 15/20; G01R 15/202
See application file for complete search history.

(56) References Cited

U.S. PATENT DOCUMENTS

| 5,652,506 | A | 7/1997 | Sorenson et al. |
| 5,717,326 | A | 2/1998 | Moriwaki |
| 6,965,225 | B2 * | 11/2005 | de Buda .................... 324/117 R |
| 7,227,348 | B2 * | 6/2007 | Sorensen ...................... 324/126 |

(Continued)

FOREIGN PATENT DOCUMENTS

| EP | 1 855 118 | 11/2007 |
| IE | 20010370 | 10/2001 |

(Continued)

OTHER PUBLICATIONS

Search Report and Written Opinion mailed on Jan. 26, 2011, for International Application No. PCT/EP2010/061917. 36 pages.

(Continued)

*Primary Examiner* — Melissa Koval
*Assistant Examiner* — Courtney McDonnough
(74) *Attorney, Agent, or Firm* — Knobbe, Martens, Olson & Bear, LLP (57) ABSTRACT

A current sensor arrangement comprises plural sensor elements arranged around a center point, each of the sensor elements having a plane of zero sensitivity to uniform magnetic fields. A first one (202) of the sensor elements has a first angular separation (X1) relative to the center point from a second, adjacent sensor element (204) and a second angular separation (X2) relative to the center point from a third, adjacent sensor element (206). The first angular separation is less than the second angular separation. An intercept (I13) of the planes of the first and third sensor elements is located outside a triangle formed by the center point and the first and third sensor elements and an intercept (I12) of the planes of the first and second sensor elements is located inside a triangle formed by the center point and the first and second sensor elements.

5 Claims, 6 Drawing Sheets

(56) References Cited

U.S. PATENT DOCUMENTS

| | | |
|---|---|---|
| 2002/0047701 A1 | 4/2002 | Kawase |
| 2003/0112000 A1* | 6/2003 | Sorenson, Jr. ............... 324/126 |
| 2003/0160603 A1 | 8/2003 | Kojovic |
| 2004/0257061 A1* | 12/2004 | de Buda .................... 324/117 R |
| 2012/0146620 A1 | 6/2012 | Dames et al. |

FOREIGN PATENT DOCUMENTS

| | | |
|---|---|---|
| JP | 10-213617 | 8/1998 |
| JP | 2005-249677 | 9/2005 |
| JP | 2006-322706 | 11/2006 |
| JP | 2007 107972 | 4/2007 |
| JP | 2007107972 A * | 4/2007 |
| WO | WO 2004-086063 | 10/2004 |
| WO | WO 2007/068221 | 6/2007 |
| WO | WO 2009-009878 | 1/2009 |
| WO | WO 2009-021076 | 2/2009 |

OTHER PUBLICATIONS

Search Report and Written Opinion mailed on Jan. 24, 2011 for International Application No. PCT/EP2010/061914. 13 pages.

International Preliminary Report on Patentability mailed on Jan. 10, 2012 for International Application No. PCT/EP2010/061917. 10 pages.

International Preliminary Report on Patentability mailed on Nov. 16, 2011 for International Application No. PCT/EP2010/061914. 14 pages.

Japanese Office Action mailed Mar. 10, 2014 with English Translation, for Japanese Patent Application No. 2012-524250, 5 pages.

* cited by examiner

CURRENT SENSOR ARRANGEMENT

REFERENCE TO RELATED APPLICATIONS

This application is the U.S. National Phase of International Application PCT/EP2010/061917, filed Aug. 16, 2010, and claims priority to United Kingdom Patent Application No. 0914259.7, filed Aug. 14, 2009. Each of the priority applications is hereby incorporated by reference in its entirety.

FIELD OF THE INVENTION

This invention relates to a sensor arrangement comprising plural sensor elements arranged around a centre point.

BACKGROUND

In the field of electrical distribution, it is useful to be able to measure current flowing through conductors. Often these conductors are operated at high electric potential relative to ground and thus it is advantageous to make the measurement without direct electrical connection.

It is possible to make such measurements using a current transformer. Such devices use a magnetic circuit to couple the current in the conductor to be measured (primary conductor) and the current in a secondary conductor. This magnetic circuit typically consists of a yoke of ferromagnetic material having a conductive coil (the secondary conductor) wound therearound.

There are a number of drawbacks to this kind of current sensor. The magnetic circuit may saturate either as a result of impedance in the secondary circuit, the presence of a non-time varying current in the primary conductor, or the presence of an externally imposed magnetic field. Any of these conditions results in the current sensor losing accuracy. Furthermore, hysteresis in the magnetic circuit leads to non-linear sensor response at low operating current.

Most modern current sensors can be constructed using surface coils uniformly spaced around a central cavity through which the primary conductor passes. These are known as Rogowski sensors. Rogowski sensors include an air core, rather than a magnetic core. Surface coils include one or more turns of a conductor provided on a substrate, for example by etching or using printed circuit board technology. In order to obtain a good rejection of magnetic fields that are not due to the primary conductor, the surface coils are very precisely aligned on axes radial to a central axis of cavity through which the primary conductor passes. Such a sensor is described in U.S. Pat. No. 6,965,225 B2.

Figure 1A:
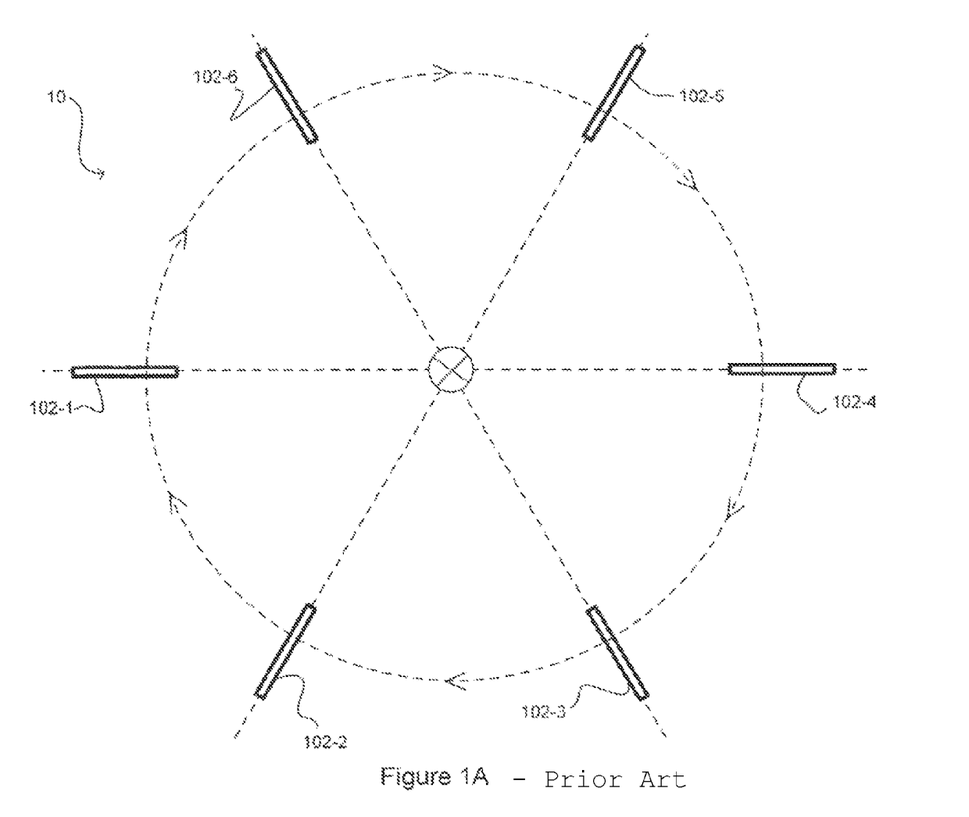
FIG. 1A depicts a sensor arrangement according to the prior art.
Figure 1B:
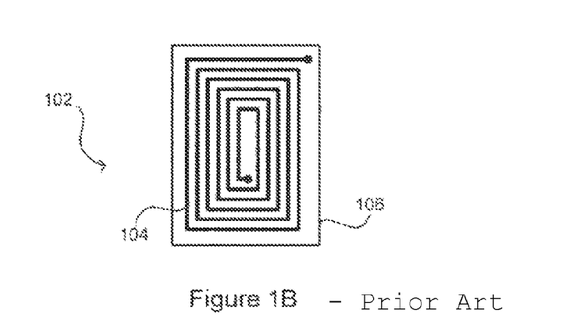
FIG. 1B depicts a sensor element of the sensor arrangement of FIG. 1A.

FIG. 1A is a schematic of a current transformer 10 such as is known in the art. The current transformer 10 is interchangeably referred to as a sensor arrangement 10 in the following. The current transformer 10 comprises a plurality of sensor elements 102-1 to 102-6 arranged around a central point through which the primary conductor 100 passes when the current transformer 10 is in use. Each of the sensor elements 102 comprises one or more turns of a conductive material 104 provided on a substrate 106. A single sensor element 102 is shown in FIG. 1B.

The substrates 104, and thus also the sensor elements 102, are aligned radially with the central point. Each of the sensor elements 102 is configured such that when a magnetic field passes through it a current (also referred to herein as a signal) is induced in the sensor element 102. The signal induced due to a magnetic field passing through in a first direction is positive, while the signal induced by a magnetic field passing through in a second opposite direction is negative. The plural sensor elements 102 which of which the sensor arrangement 10 is comprised are arranged such that a circular magnetic field due to the primary conductor causes signals of the same sign to be induced in each of the sensor elements 102. As such, the signals from each of the sensor elements 102 sums with the signals of the other sensor elements 102. In FIG. 1A a current is flowing through the primary conductor in a direction into the page, which causes a circular magnetic field in a clockwise direction (which is denoted by the dashed circle and arrows).

Sensor arrangements such as that shown in FIG. 1A exhibit good far-field performance (i.e. a high level of rejection of fields not due to the primary conductor) due to the precise radial alignment of the sensor elements, the equal spacing of the sensor elements around the centre, and the fact that each sensor arrangement has the same configuration as the others.

U.S. Pat. No. 6,965,225 B2 describes a sensor arrangement similar to that of FIG. 1A. The sensor arrangement of U.S. Pat. No. 6,965,225 B2 is adapted so as to be retro-fittable to an existing conductor. This involves a mechanical hinge system whereby the sensor elements can be temporarily separated so as to allow the primary conductor to be passed between them.

The present invention provides a retro-fittable sensor arrangement which can require no moving parts and therefore be cheaper to manufacture and less prone to mechanical failure than this prior art arrangement.

SUMMARY OF INVENTION

A first aspect of the invention provides a sensor arrangement comprising plural sensor elements arranged around a centre point, each of the sensor elements having a plane of zero sensitivity to uniform magnetic fields, a first one of the sensor elements having a first angular separation relative to the centre point from a second, adjacent sensor element and having a second angular separation relative to the centre point from a third, adjacent sensor element, the first angular separation being less than the second angular separation, wherein an intercept of the planes of the first and third sensor elements is located outside a triangle formed by the centre point and the first and third sensor elements and wherein an intercept of the planes of the first and second sensor elements is located inside a triangle formed by the centre point and the first and second sensor elements.

The first to third sensor elements may be provided such that each exactly meets the conditions:

the first angular separation plus the second angular separation is equal to 2*360 degrees/N, where N is the number of sensor elements; and an angle between a vector in the plane of the sensor element that is extending generally towards the centre point and a vector extending from a centre of the respective sensor element directly towards the centre point is equal to N/8*(the second angular separation minus the first angular separation).

The first to third sensor elements may be provided such that each substantially meets the conditions:

the first angular separation plus the second angular separation is equal to 2*360 degrees/N, where N is the number of sensor elements; and an angle between a vector in the plane of the sensor element that is extending generally towards the centre point and a vector extending from a centre of the respective sensor element directly towards the centre point is equal to N/8*(the second angular separation minus the first angular separation).

The first sensor element may comprise a first main sensor element and a first additional sensor element each having the same plane of zero sensitivity that comprises the plane of zero sensitivity of the first sensor element, a position of the first sensor element being constituted by a position of an equivalent dipole formed by the first main sensor element and the first additional sensor element when in use.

The sensor arrangement may comprise plural sensor elements arranged in pairs, the angular separation between sensor elements of each pair being less than the angular separation between one of the sensor elements of the pair and a closest sensor element of an adjacent pair of sensor elements.

BRIEF DESCRIPTION OF THE DRAWINGS

Embodiments of the invention will now be described, by way of example, with reference to the accompanying drawings, in which.

DETAILED DESCRIPTION OF THE EMBODIMENTS

In the above-mentioned drawings and below-described embodiments, like reference numerals refer to like elements throughout.

Figure 2A:
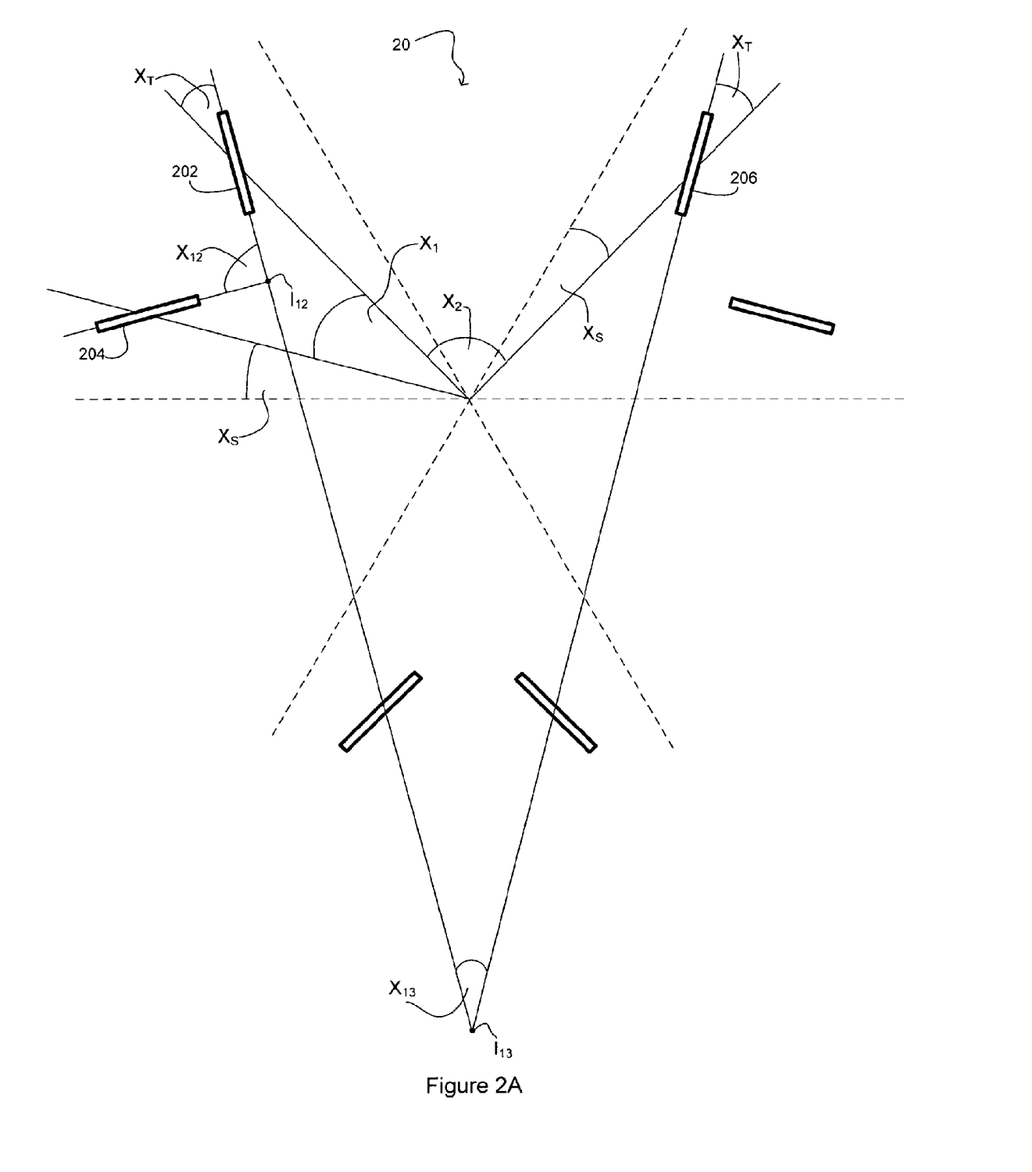
FIGS. 2A and 2B depict a sensor arrangement according to a first embodiment of the invention.

FIG. 2A shows a sensor arrangement 20 according to a first embodiment of the invention.

The sensor arrangement 20 according to the first embodiment of the invention includes a plurality of sensor elements 202, 204, 206 etc. which may be similar to that depicted in FIG. 1B. The sensor elements 202, 204, 206 etc. are arranged around a centre point. The sensor arrangement 20 is operable to detect a current flowing through a primary conductor which passes near the centre point in a direction substantially perpendicular to the page. Each sensor element 202, 204, 206 etc. has zero sensitivity to uniform magnetic fields which are parallel to a plane that passes through the sensor element 202, 204, 206 etc. Hereafter, these planes are referred to as planes of zero sensitivity to uniform magnetic fields, or simply planes of zero sensitivity.

The inventors have discovered that the sensor elements 202, 204, 206 etc. can be placed around the centre point at unequally spaced locations whilst achieving far-field performance comparable to that exhibited by the prior art sensor arrangement of FIG. 1A. However, in order to achieve this, the positions and alignments of the sensor elements 202, 204, 206 etc. if the of the coils must are adjusted generally according to a specific relationship.

In FIG. 2A, the dashed lines represent radial axes having equal angular separation upon which the sensor elements 102 of the prior art sensor arrangement 10 of FIG. 1A were located. It can be seen from FIG. 2A that each of the sensor elements 202, 204, 206 etc. of the arrangement 20 according to the first embodiment has been displaced from the equally spaced locations of the sensor elements 102 of the prior art sensor 10. The angle by which the position of a sensor element 202, 204, 206 etc. is shifted from its respective location in the prior art sensor arrangement 10 is hereafter called the shift angle $X_S$.

In the prior art arrangement 10 of FIG. 1A each of the sensor elements 102 is arranged such that the plane of zero sensitivity of the sensor element 102 is aligned with a radial axis extending from the centre point. In other words, a plane of the substrate on which the sensor element is provided is radial to the centre point of the prior art arrangement 10.

In the sensor arrangement of FIG. 2A, however, the sensor elements 202, 204, 206 etc. are not aligned with the radial axes upon which they are located. In other words, the plane of zero sensitivity of the sensor element is at an angle to the radial axis upon which its centre lies. In this example, the plane of the substrate on which the sensor element is provided is the same as the plane of zero sensitivity. Put another way, the sensor element has a plane that is the same as the plane of zero sensitivity. Consequently, in this example, the plane of the substrate on which the sensor element is provided is at an angle to the radial axis upon which its centre lies. The angle between a vector in the plane of zero sensitivity of a sensor element 202, 204, 206 etc. pointing generally (or most) towards the centre point and a vector aligned with the radial axis and pointing towards the centre point is hereafter called the tilt angle $X_T$.

A general relationship between the positions and orientations of the sensor elements 202, 204, 206 etc. in an N-sensor arrangement, which maintains the same level of far-field performance as the prior art arrangement 10 can be described with reference to three adjacent sensor elements, hereafter referred to as the first sensor element 202, the second sensor element 204, and the third sensor element 206.

As can be seen in FIG. 2A, the first sensor element 202 is separated from the second sensor element 204 by a first angular separation $X_1$ relative to the centre point. The first sensor element is separated from the third sensor element 206 by a second angular separation $X_2$ relative to the centre point.

In the sensor arrangement 20, the following three criteria are true. Meeting these criteria allows the sensor arrangement 20 to exhibit the same level of far-field performance as the prior art sensor arrangement 10.

1) The second angular separation $X_2$ is larger than the first angular separation $X_1$;
2) An intercept $I_{13}$ of the planes of zero sensitivity of the first and third sensor elements is located outside a triangle formed by the centre point and (centre points of) the first and third sensor elements 202, 206; and
3) An intercept $I_{12}$ of the planes of zero sensitivity of the first and second sensor elements 202, 204 is located inside a triangle formed by the centre point and (centre points of) the first and second sensor elements 202, 204.

Described another way, the three above criteria are as follows:

1) The second angular separation $X_2$ is larger than the first angular separation $X_1$;
2) An angle $X_{T12}$ between a vector in the plane of the first sensor element 202 which extends generally towards the centre point and a vector in the plane of the second sensor element 204 that extends generally towards the centre point is greater than the first angular separation $X_1$; and
3) An angle $X_{T13}$ between a vector in the plane of the first sensor element 202 that extends generally towards the centre point and a vector in the plane of the third sensor element 206 that extends generally towards the centre point is less than the second angular separation $X_2$.

More specifically and optimally, the relationship between the tilt angle $X_T$ and the shift angle $X_S$ is given by:

$$X_T = N \times X_S / 2 \qquad \text{[EQUATION 1]}$$

Where N is the number of sensor elements, which in this example is 6.

The tilt angle $X_T$ can also be defined with reference to the first and second angular separations $X_1$, $X_2$ (assuming the above criteria are satisfied), as can be seen below:

$$X_T = N \times (X_2 - X_1) / 8 \qquad \text{[EQUATION 2]}$$

The application of the shift angle $X_S$ and the tilt angle $X_T$ allows the distance between two adjacent sensor elements 202, 206 to be increased relative to the distance between two adjacent sensor elements 102 of the equally spaced sensor arrangement of FIG. 1A in the prior art. This can most clearly be seen in FIG. 2B in which the sensor elements 102 of the prior art arrangement 10 corresponding to the first and third sensor elements 202, 206 of arrangement 20 of the first embodiment are shown (in broken lines) in conjunction with the arrangement 20 of the first embodiment. The distance A1 between the prior art sensor elements 102 is clearly smaller than the distance A2 between the first and third sensor elements 202, 206 of the arrangement 20 of the first embodiment. Consequently, the invention allows a sensor device to be constructed which can be applied to a conductor (that would normally be insulated) without moving parts and without the need to interrupt the current flow in the primary conductor.

Figure 3A:
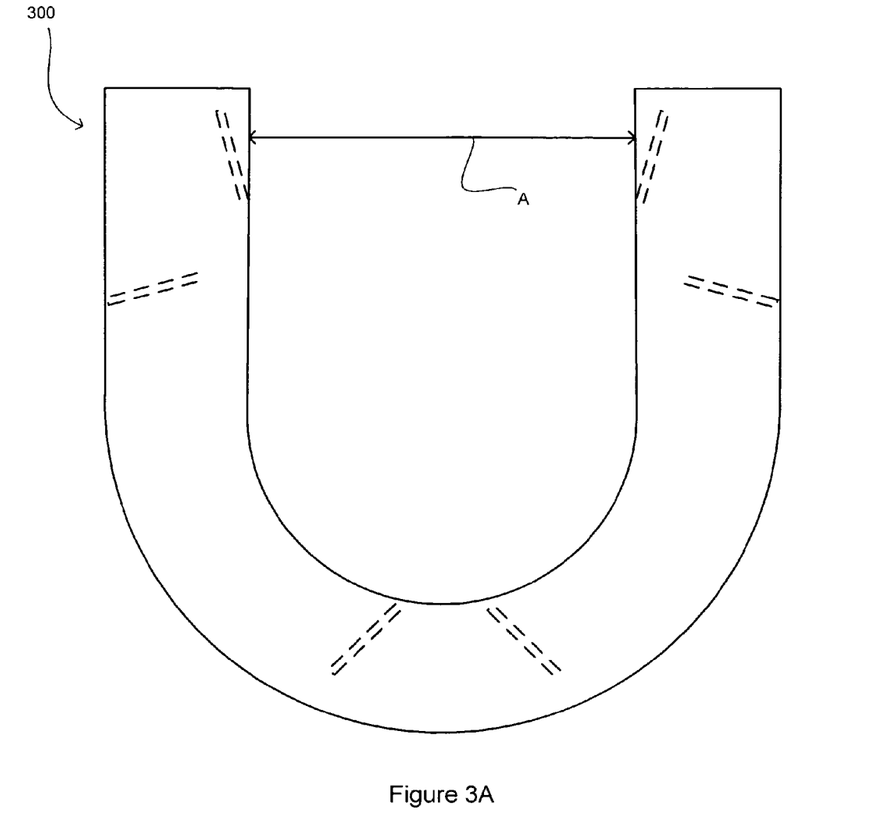
FIGS. 3A and 3B depict a sensor device according to the first embodiment of the invention.
Figure 3B:
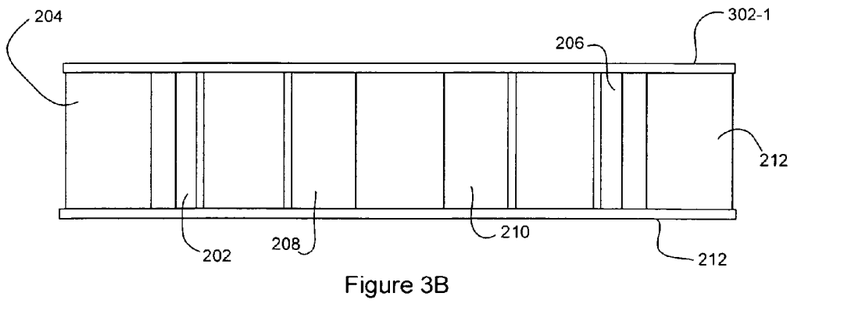

FIGS. 3A and 3B depict a plan- and side-view respectively of a sensor device 300 according to the first embodiment of the invention.

Figure 2B:
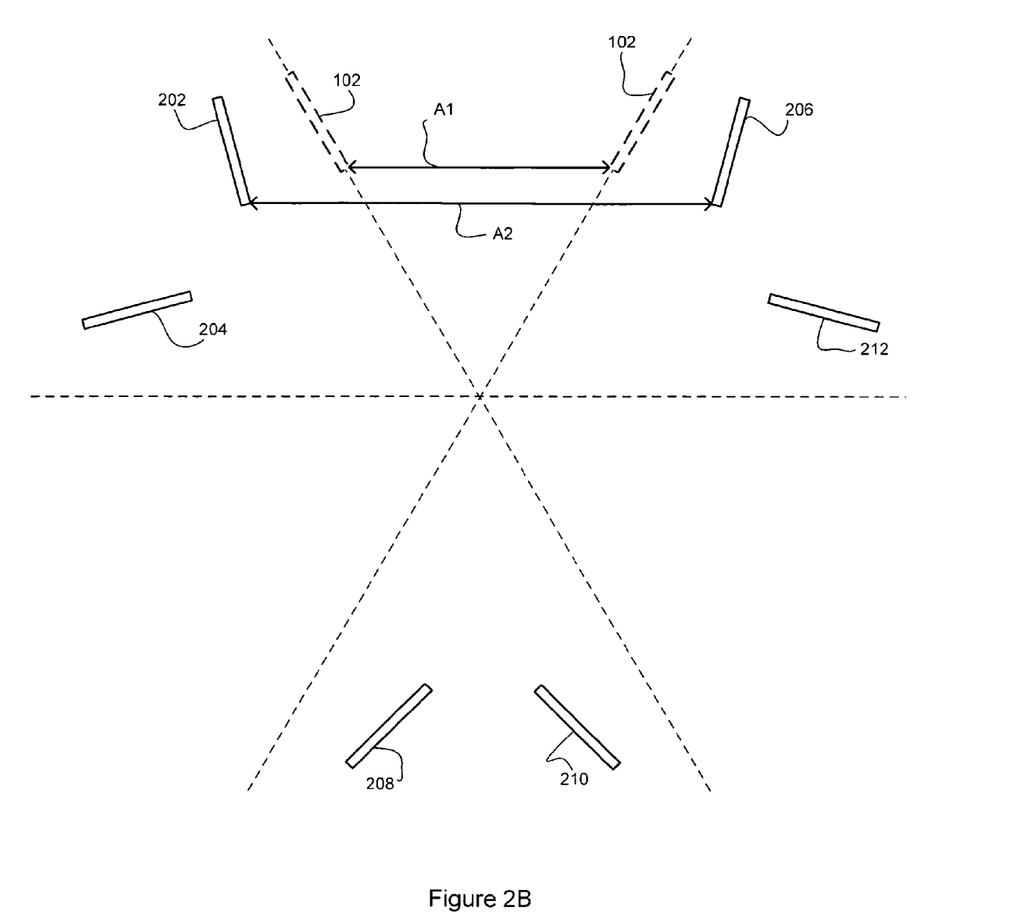

The device comprises the sensor arrangement shown in FIGS. 2A and 2B. The arrangement of sensor elements 202, 204, 206 etc. is provided in a rigid frame 302. The rigid frame comprises top and bottom portions 302-1, 302-2 which may be connected together, for example using a plastic bolt or bolts (not shown) which pass(es) from the top portion 302-1 to the bottom portion 302-1 of the frame. The frame 302 may have slots formed in inner surfaces of the top and bottom portions 302-1, 302-2 for supporting the edges of the substrates of the sensor elements 202, 204, 206 etc. Alternatively the edges of the substrate boards are held against the inner surfaces of the top and bottom portions 302-1, 302-2 of the frame. According to alternative embodiments, the substrates are insert moulded. The sensor device of FIGS. 3A and 3B may also include signal conditioning components (not shown) provided on the substrates.

When in use, the device FIG. 3 is moved towards a subject conductor, the current flowing through which is to be measured, until the conductor passes through the aperture denoted A. The magnetic field due to the conductor cause signals to be induced in the sensor elements 202, 204, 206 etc, which allows the current flowing through the conductor to be measured. By supporting the device 300 such that the conductor is within the volume bounded by the sensor elements, the device 300 can be used accurately to measure current flowing in the conductor.

Alternatively, the sensor elements could be located such that their tilt angles deviate by a small extent from the criteria stated above. Deviations from the criteria stated above reduce far field performance. However, advantages that arise from having a design that is simple and inexpensive to manufacture may outweigh a small performance reduction in many instances. Advantageously, the criteria above are met in a design. Alternatively, the angle criteria may be deviated from by a relatively small amount. In this case, additional design features may be included such as to compensate for performance changes resulting from the deviation.

Figure 4:
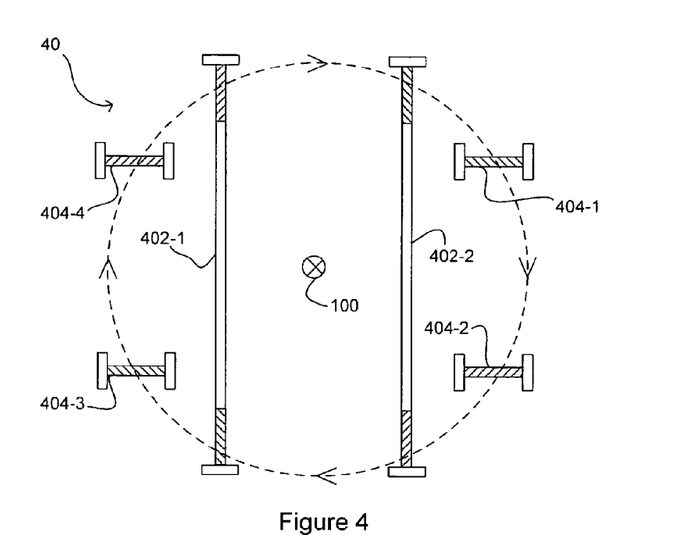
FIG. 4 depicts a sensor arrangement according to a second embodiment of the invention.

FIG. 4 depicts a sensor arrangement according to a second embodiment of the invention. In this embodiment, not all of the criteria stated above are met.

The sensor arrangement 40 of FIG. 4 comprises eight sensor elements (denoted by the hashed areas on the Figure). These are positioned relative to one another and aligned relative to the centre point either exactly or closely according to the relationships described with reference to FIG. 2A.

Two sensor elements are provided on each of two extending substrate members 402-1, 402-1. One sensor element is provided on each of four smaller substrate members 404-1, 404-2, 404-3, 404-4. The sensor elements are arranged such that the signals induced due to a circulating magnetic field sum with one another.

The two extending substrate members 402-1, 402-2 are arranged substantially parallel to one another. Two of the smaller substrate members 404-1, 404-4 lie in a first plane and the other two of the small substrate members 404-2, 404-3 lie in a second plane. The first and second planes are substantially parallel to one another and substantially perpendicular to the planes of the extending substrate members 402-1, 402-2. The provision of two sensor elements on a single substrate allows for easier and more precise alignment and manufacture of the sensor arrangement 40.

Figure 5A:
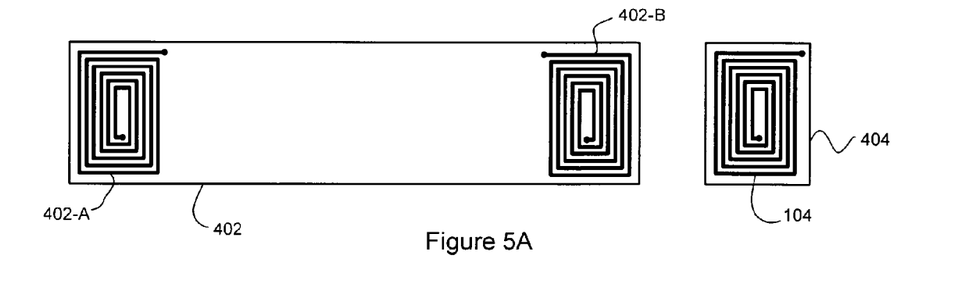
FIGS. 5A and 5B illustrate components of the sensor arrangement of FIG. 4.

FIG. 5A shows an example of the extending substrate members 402 and the small substrate members 404.

The extending substrate boards include at each end one or more turns of a conductor, which form the sensor elements 402-A, 402-B. The sensor elements 402-A, 402-B on the extending sensor member are oppositely-configured (i.e. oppositely coiled or wound). As such, signals induced in the sensor elements 402-A, 402-B due to a uniform (or far) field passing through the extending sensor member cancel such that the net signal between the two sensor elements is zero.

The small substrate board may be substantially as described with reference to FIG. 1B.

The tilting and movement of the sensor elements (as described with reference to FIGS. 2A and 2B and exhibited by the arrangement of FIG. 4) relative to the equally spaced radial arrangement of the prior art maintains the far-field performance compromises the uniformity of sensitivity to current flowing through a conductor 100 provided across the sensing volume. However, this can be corrected for by introducing additional sensor elements into the sensor arrangement.

Figure 5B:
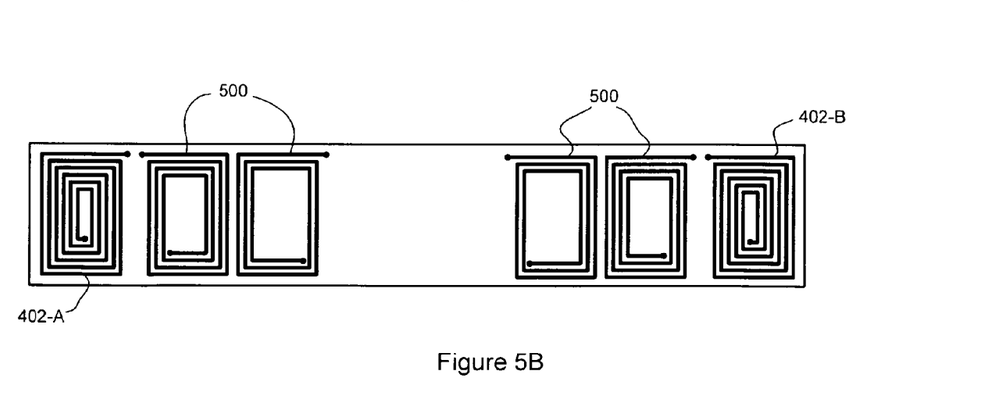

FIG. 5B shows a one of the extending substrate boards of the embodiment of FIG. 4 including additional sensor elements 500. The additional sensor elements 500, which are additional to the main sensor elements 402-A and 402-B have an effect of correcting the uniformity of sensitivity. This aspect is described and claimed in a co-pending application filed on even date herewith to the same applicant, the contents of which are incorporated by reference.

The additional sensor elements 500 also have an effect of moving the position of a dipole provided by the main sensor elements 402-A, 402-B. The main sensor elements are modified to account for the additional sensor elements. In particular, the number of turns of conductor material of the main sensor elements may be modified to maintain a similar turn area to a non-compensated design. Also, the position of the main sensor elements is modified to maintain the effective dipole position of an uncompensated design. The person skilled in the art will know how to calculate main and additional sensor elements parameters and locations in order to achieve a particular design requirement.

Figure 6A:
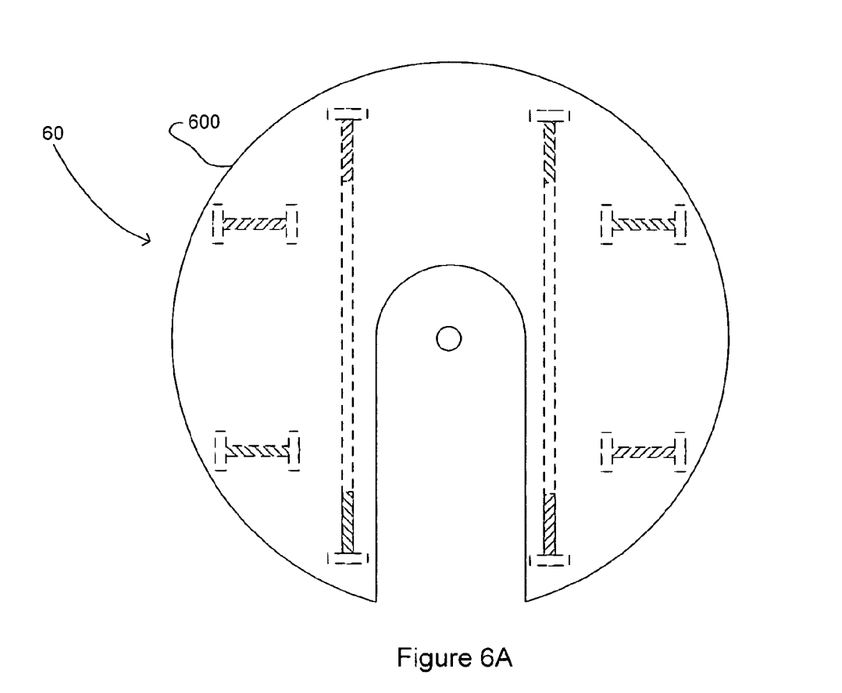
FIGS. 6A and 6B depict a sensor device according to the second embodiment of the invention.
Figure 6B:
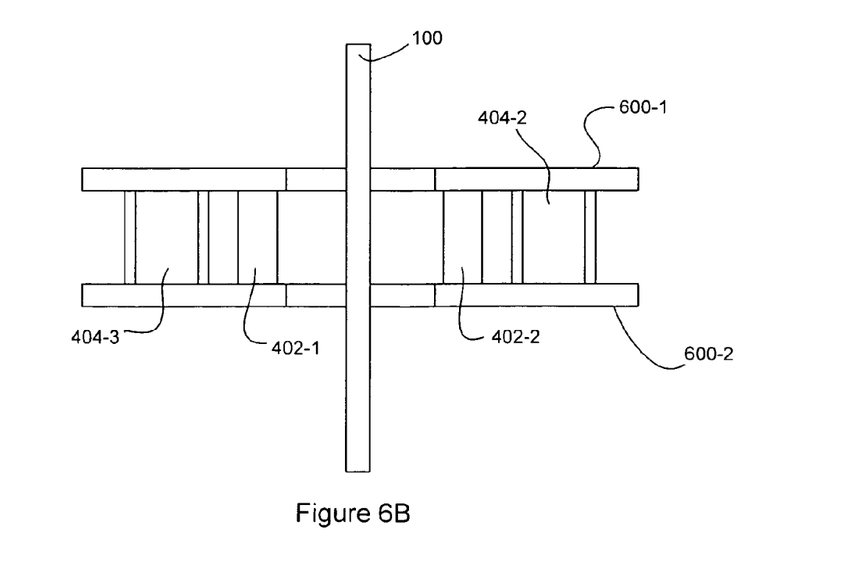

FIGS. 6A and 6B show a sensor device 60 according to the second embodiment of the invention in situ around the conductor.

The device 60 comprises the sensor arrangement 40 shown in FIG. 4. The arrangement of sensor elements 404, 402 is provided in a rigid frame 600. The rigid frame 600 comprises top and bottom portions 600-1, 600-2 which may be connected together, for example using a plastic bolt or bolts (not shown) which pass(es) from the top portion 600-1 to the bottom portion 600-1 of the frame. The frame 600 may have slots formed in inner surfaces of the top and bottom portions 600-1, 600-2 for supporting the edges of the substrates of the sensor elements 404, 402. Alternatively the edges of the substrate members may be held against the inner surfaces of the top and bottom portions 600-1, 600-2 of the frame. According to alternative embodiments, the substrates members are insert moulded. The sensor device of FIGS. 6A and 6B may also include signal conditioning electronics (not shown) provided on the substrates.

Locations of the sensor elements in the FIGS. 4 and 6 embodiments are such that they meet the criteria stated above in relation to the FIGS. 2 and 3 embodiments, but may not strictly meet the terms of the equations provided above. The locations of the sensor elements on the extending substrate members 402-1 and 402-2 is defined by the distance between the centres of the sensor elements on each board and by the separation of the extending substrate members. The locations of the smaller substrate members 404-1, 404-4 is selected such that the sensor elements supported by those members are symmetrical to the sensor elements supported on the extending substrate members 402-1 and 402-2.

With the boards of FIG. 5B additional sensor elements 500 are provided on the 402-1 and 402-2 with parameters (e.g. number of turns) and positions such as to move the positions of the dipole in effect provided by the combinations of the main sensor elements 402 and the additional sensor elements 500 so that the terms of the equations are met, or at least are substantially met. The additional sensor elements 500, by moving the dipole, also adjust the tilt angle $X_T$ and the shift angle $X_F$.

Parameters of one example are as follows:

For the sensor elements 404, turns of conductive material with areas of 625 mm are positioned at of 32 mm from tangent position.

For elements 402, turns of conductive material with areas 855 mm squared at 29 mm from tangent position. The additional sensor element 500 comprises turns of conductive material with areas negative 340 mm squared (because the conductive material is oppositely would) at 18 mm from tangent position and turns of conductive material with areas 110 mm squared at 12 mm from tangent position.

The sum of the turns area of the element 402 and the additional sensor element 500 is 625 mm squared, which is the same as the turns area of the sensor element 404.

The equivalent dipole position is given by averaging the positions weighted by the turn area product. The equivalent position is therefore (855*29−340*18+110*12)/(855−340+110)=32 mm.

This gives rise to values as follows: $X_1$ is 30.4 degrees, $X_2$ is 59.6 degrees, $X_{T13}$ is zero degrees (because the sensor elements are parallel) and $X_{T12}$ is 90 degrees. $X_T$ is 29.8 degrees, and $X_S$ is 7.3 degrees.

As such, the terms of the equations are substantially met.

According to some embodiments of the invention, sensor devices including eight sensor elements each spaced 35 mm from the centre point can exhibit 16 nodes in the far-field response and 16 planes of uniform sensitivity dipole while at the same time providing a clear aperture of 35 mm through which the primary conductor can be passed.

The number of sensor elements advantageously is even, formed in at least two sets each of two sensors. However, the number of sensor elements may alternatively be odd.

It should be realized that the foregoing embodiments should not be construed as limiting. Other variations and modifications will be apparent to persons skilled in the art upon reading the present application. Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

The invention claimed is:

1. A sensor arrangement comprising plural sensor elements arranged around a centre point, each of the sensor elements having a plane of zero sensitivity to uniform magnetic fields, a first angular separation between a position of a dipole provided by a first one of the sensor elements and a position of a dipole provided by a second, adjacent sensor element being less than a second angular separation between the position of the dipole provided by the first one of the sensor elements and a position of a dipole provided by a third, adjacent sensor element, the first and second angular separations being relative to the centre point of the arrangement,
wherein an intercept of the planes of the first and third sensor elements is located outside a triangle formed by the centre point and the first and third sensor elements and wherein an intercept of the planes of the first and second sensor elements is located inside a triangle formed by the centre point and the first and second sensor elements.

2. The sensor arrangement of claim 1, wherein the first to third sensor elements are provided such that each exactly meets the conditions:
the first angular separation plus the second angular separation is equal to 2*360 degrees/N, where N is the number of sensor elements; and
an angle between a vector in the plane of the sensor element that is extending generally towards the centre point and a vector extending from a centre of the respective sensor element directly towards the centre point is equal to N/8*(the second angular separation minus the first angular separation).

3. The sensor arrangement of claim 1, wherein the first to third sensor elements are provided such that each substantially meets the conditions:
the first angular separation plus the second angular separation is equal to 2*360 degrees/N, where N is the number of sensor elements; and
an angle between a vector in the plane of the sensor element that is extending generally towards the centre point and a vector extending from a centre of the respective sensor element directly towards the centre point is equal to N/8*(the second angular separation minus the first angular separation).

4. The sensor arrangement of claim 1, wherein the first sensor element comprises a first main sensor element and a first additional sensor element each having the same plane of zero sensitivity that comprises the plane of zero sensitivity of the first sensor element, the position of the dipole provided by the first sensor element being constituted by a position of an equivalent dipole formed by the first main sensor element and the first additional sensor element when in use.

5. A sensor arrangement as claimed in claim 1, comprising plural sensor elements arranged in pairs, the angular separation between sensor elements of each pair being less than the angular separation between one of the sensor elements of the pair and a closest sensor element of an adjacent pair of sensor elements.

* * * * *